United States Patent [19]

McCullough

[11] Patent Number: 5,767,523
[45] Date of Patent: Jun. 16, 1998

[54] MULTIPLE DETECTOR ALIGNMENT SYSTEM FOR PHOTOLITHOGRAPHY

[75] Inventor: Andrew W. McCullough, Newtown, Conn.

[73] Assignee: SVG Lithography Systems, Inc., Wilton, Conn.

[21] Appl. No.: 838,549

[22] Filed: Apr. 9, 1997

[51] Int. Cl.$^6$ .................................................. G01N 21/86
[52] U.S. Cl. .................. 250/548; 250/559.3; 250/208.1; 356/401
[58] Field of Search ................... 250/548, 559.3, 250/559.44, 237 G, 208.1; 356/399–401; 355/53

[56] References Cited

U.S. PATENT DOCUMENTS

| | | | |
|---|---|---|---|
| 4,504,148 | 3/1985 | Kuroki et al. | 356/401 |
| 4,545,683 | 10/1985 | Markle | 356/400 |
| 4,549,084 | 10/1985 | Markle | 250/548 |
| 4,578,590 | 3/1986 | Wu | 250/548 |
| 4,579,453 | 4/1986 | Makita | 356/375 |
| 4,697,087 | 9/1987 | Wu | 250/548 |
| 5,463,216 | 10/1995 | Van Berkel | 250/208.1 |
| 5,477,057 | 12/1995 | Angeley et al. | 250/548 |

*Primary Examiner*—Que Le
*Attorney, Agent, or Firm*—Fattibene & Fattibene; Paul A. Fattibene; Arthur T. Fattibene

[57] ABSTRACT

A positioning, alignment, and image quality system comprising a detector having a photosensitive surface covered with an opaque layer having predetermined openings therein, a matched reticle having predetermined apertures therein is used to project the image of the apertures onto the openings. A plurality of different detectors are thereby formed on a single monolithic substrate for providing positioning, alignment, and image quality information. Different sub-detectors provide general positioning information, fine alignment or position information, and image quality information, such as optimum focus and astigmatism. In one embodiment, a pair of rectangular openings having a predetermined distance therebetween is used. An illumination pattern is projected between the rectangular openings filling a portion of the rectangular openings thereby providing a signal. The signals from the two openings are balanced or made equal to obtain positioning information or alignment of the reticle and the detector, and correspondingly a wafer stage attached to the detector. Different opening configurations in the opaque mask covering the photosensitive layer are used to provide different imaging information. The present invention permits alignment information to be obtained in a non-scanning system, as well as in a system using pulsed illumination sources. Additionally, a plurality of sub-detectors may easily be fabricated onto a monolithic detector providing different functions.

24 Claims, 4 Drawing Sheets

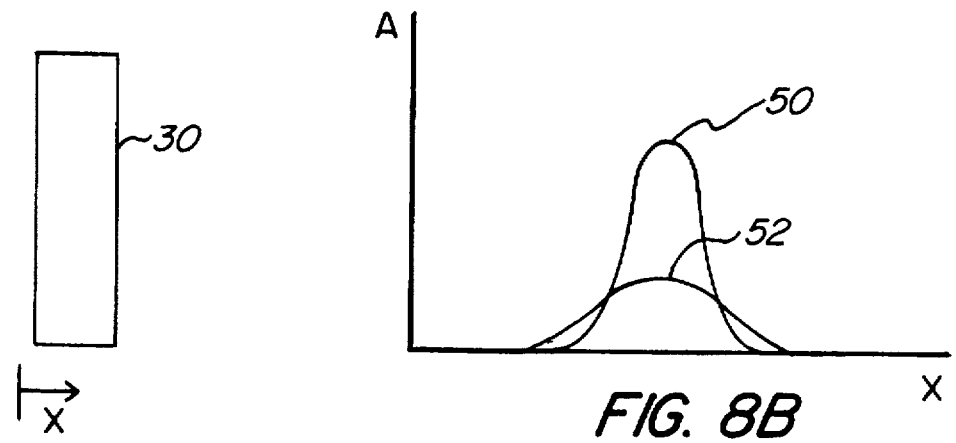
FIG. 8A
FIG. 8B
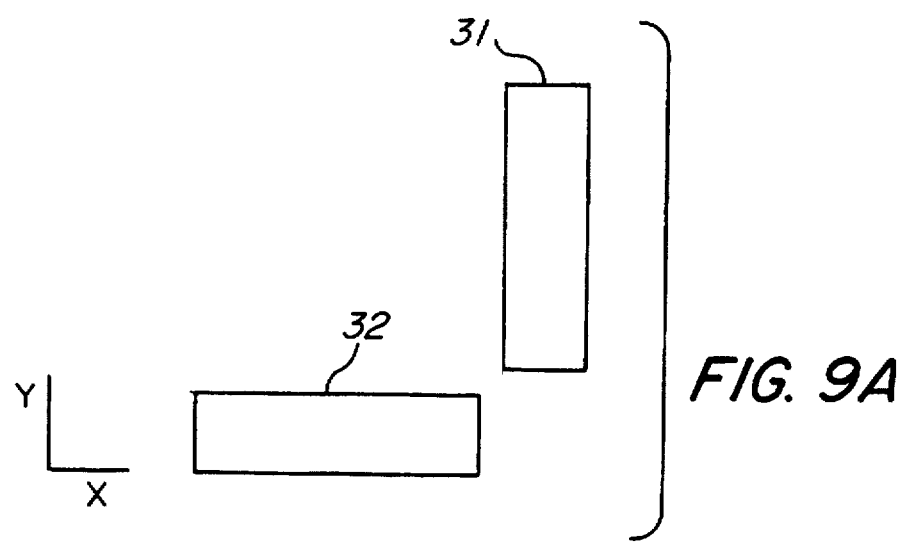
FIG. 9A
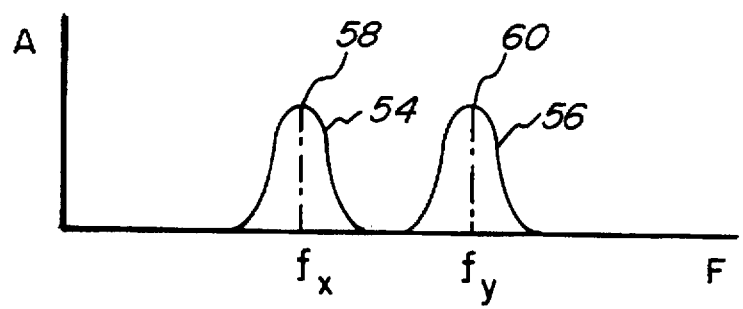
FIG. 9B

MULTIPLE DETECTOR ALIGNMENT SYSTEM FOR PHOTOLITHOGRAPHY

FIELD OF THE INVENTION

The present invention relates generally to photolithography as used in the manufacture of semiconductors, and more specifically to a multiple purpose detector used to provide imaging information.

BACKGROUND OF THE INVENTION

The manufacture of semiconductor circuits has as a key step the use of photolithographic techniques. In the photolithographic process, there is a need to position a wafer coated with a photosensitive compound, generally known as photo resist, relative to the image of a mask or reticle containing circuit patterns thereon. Because the processing requires multiple layers to be placed on the wafer, precise positioning of these multiple layers is required. The position of the reticle image and the wafer often must be known and aligned within a range of some nanometers.

One such alignment system is disclosed in U.S. Pat. No. 4,697,087 entitled "Reverse Dark Field Alignment System For Scanning Lithographic Aligner" issuing to Frederick Y. Yu on Sep. 29, 1987, which is herein incorporated by reference. Therein disclosed is an alignment system wherein a wafer having a wafer target thereon, and a mask having a mask target thereon, are aligned with respect to each other. In this alignment system, a target on the wafer and a target on a reticle are scanned relative to each other. The reflected light is detected and compared to determine any misalignment. Another alignment system is disclosed in U.S. Pat. No. 4,549,084 entitled "Alignment And Focusing Systems For Scanning Mask Aligner", issuing to David A. Markle on Oct. 22, 1985, which is herein incorporated by reference. Therein disclosed is an alignment system employing a pattern on the mask and wafer including optical grids corresponding to the directions and spacing of the patterns so that light transmitted through the grids is strongly modulated. The light modulated from the mask and wafer alignment targets is used to obtain alignment error signals, as well as to measure how well the mask is focused on the wafer. Another alignment system is disclosed in U.S. Pat. No. 5,477,057 entitled "Off Axis Alignment System For Scanning Photolithography", issuing to David Angeley et al on Dec. 19, 1995. Therein disclosed is an alignment system having multiple detectors for detection of light scattered and reflected from alignment marks placed on a wafer.

While these alignment systems have proven adequate for their intended purpose with scanning photolithography and continuous light sources, they may have difficulty providing adequate alignment signals in other applications, for example, with use of pulsed illumination sources, or static or stepped photolithography techniques where scanning may not be employed. Therefore, there is a need to provide adequate alignment between a reticle and a wafer when a pulsed illumination source is used, as well as not being dependent on the scanning movement of a reticle and wafer in order to obtain alignment information. Additionally, there is a need to obtain other image information from a single detector that is relatively simple and easy to manufacture or modify, depending upon the particular application and imaging information desired, such as focus or image quality monitoring.

SUMMARY OF THE INVENTION

The present invention is directed to a detector and system used in obtaining imaging information, such as aligning a reticle to a pre-existent pattern on a semiconductor wafer via alignment of the reticle image to the pattern pre-existent over a detector array and/or obtaining image quality information. The image of a reticle having predetermined apertures therein is projected onto a detector placed on an X-Y stage. The detector has a photosensitive layer forming a rectangular or other regular array of individual elements or cells, such as a CCD or charge coupled device. Covering a portion of the photosensitive layer is an opaque layer. The opaque layer has predetermined openings matched to the apertures in the reticle. The openings are configured such that positioning and image quality information, such as focus and astigmatism, are obtained from the signal read from the individual elements. The image of the reticle, illuminated by a source, is projected by a projection optic onto the predetermined or matched openings in the opaque layer, thereby generating a signal. Multiple openings can be used on a single monolithic photosensitive element, with the detector being divided into sub-detector regions. One sub-detector region, which may have multiple independent individual elements, has openings in the opaque layer for determining position by balancing the illumination from filled or exposed portions of adjacent openings. The illumination filled portions are illuminated by a predetermined illumination pattern from apertures in the reticle. Other sub-detector regions detect image quality, such as focus and astigmatism by projecting the image of predetermined or matched apertures in the reticle onto predetermined or matched holes in the opaque layer. In one embodiment, optimum focus is obtained by focusing a predetermined illumination pattern onto a predetermined opening, and maximizing the signal. In another embodiment, astigmatism is obtained by sequentially focusing a predetermined image of an aperture in the reticle onto predetermined openings in the opaque layer having orthogonal axes.

Accordingly, it is an object of the present invention to provide a relatively simple detector having multiple purposes.

It is an additional object of the present invention to provide a detector that can be easily manufactured and modified depending upon the particular application.

It is an advantage of the present invention that imaging information, such as alignment or position information is obtained with a pulsed source.

It is a further advantage of the present invention that alignment or position information is obtained without the need of scanning.

It is a further advantage of the present invention that the structure of the detector permits easy fabrication of multiple elements for redundancy.

It is a feature of the present invention that predetermined openings, which are matched to predetermined apertures in a reticle, are placed in an opaque layer and the signals obtained contain information that can be used for the purposes discussed herein.

It is a further feature of the present invention that a monolithic detector is used that is divided into sub-detectors having different functions.

These and other objects, advantages, and features will be readily apparent in view of the following detailed description.

3

Figure 2:
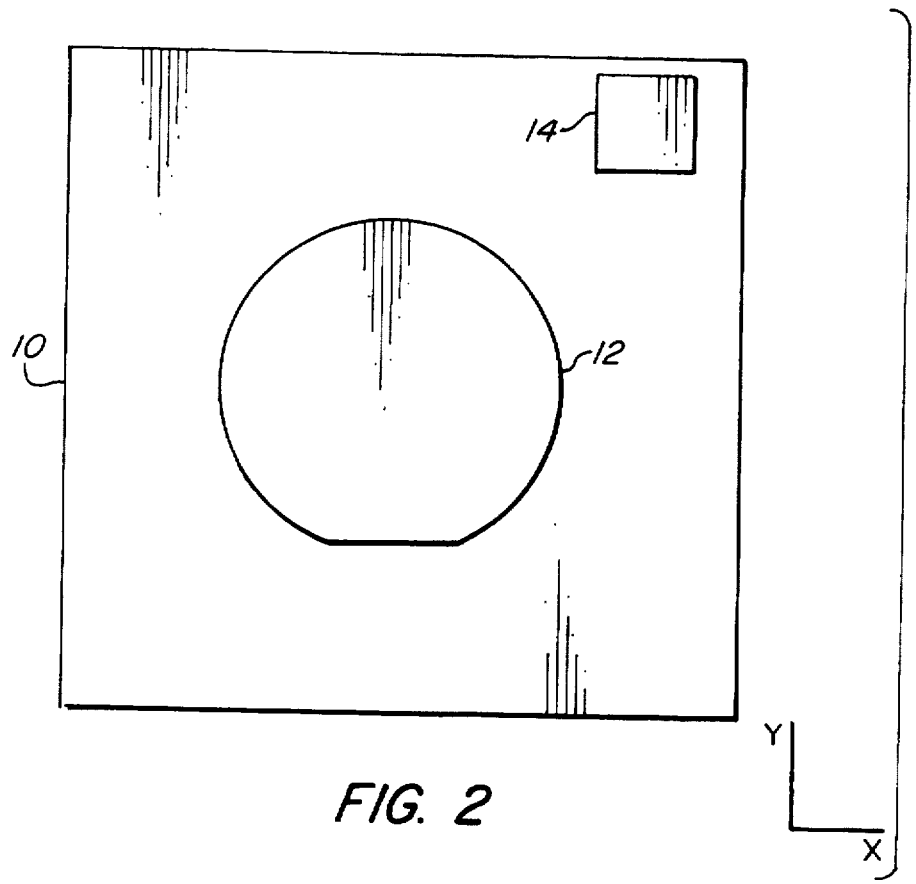

FIG. 2 is a schematic plan view of a wafer stage.

Figure 3:
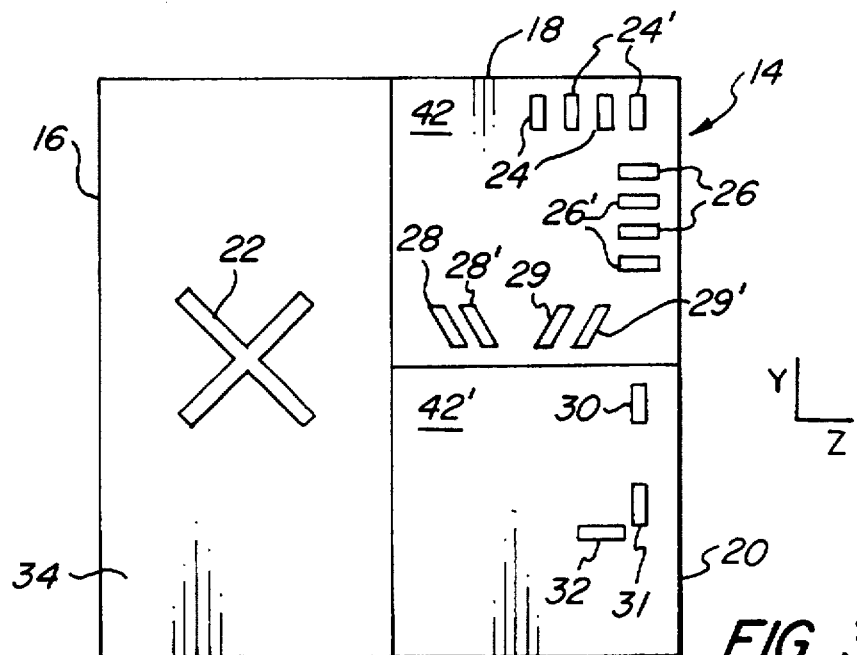

FIG. 3 is a schematic plan view of a detector illustrating the openings therein.

Figure 4:
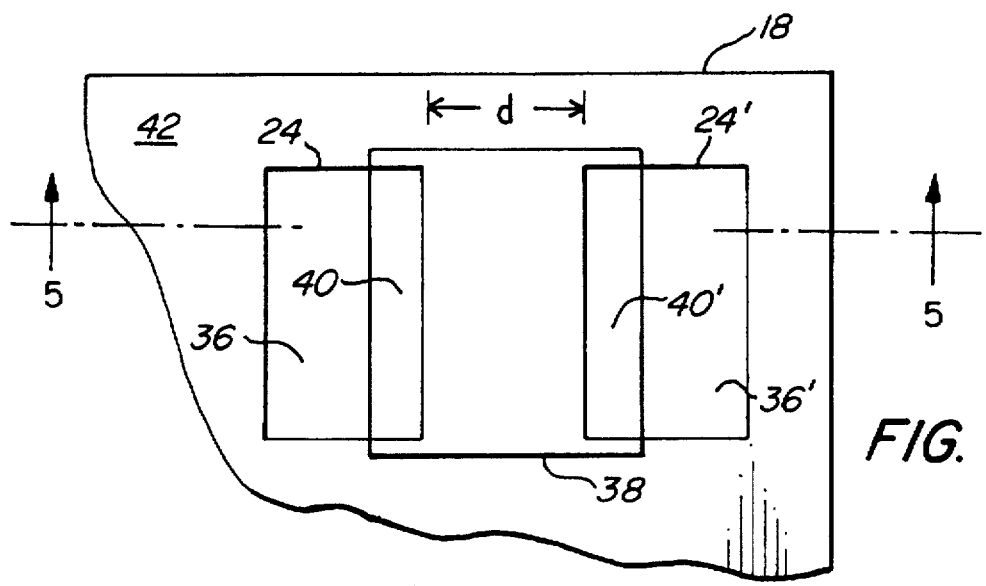

FIG. 4 is a schematic plan view of a portion of the detector illustrated in FIG. 3.

Figure 5:
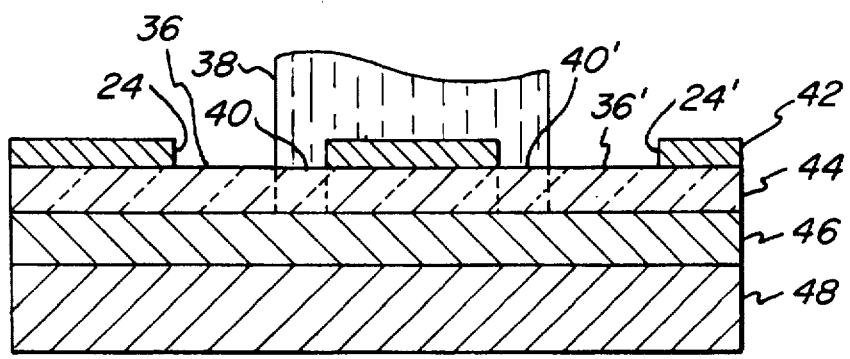

FIG. 5 is a cross section taken along line 4—4 in FIG. 4.

Figure 6:
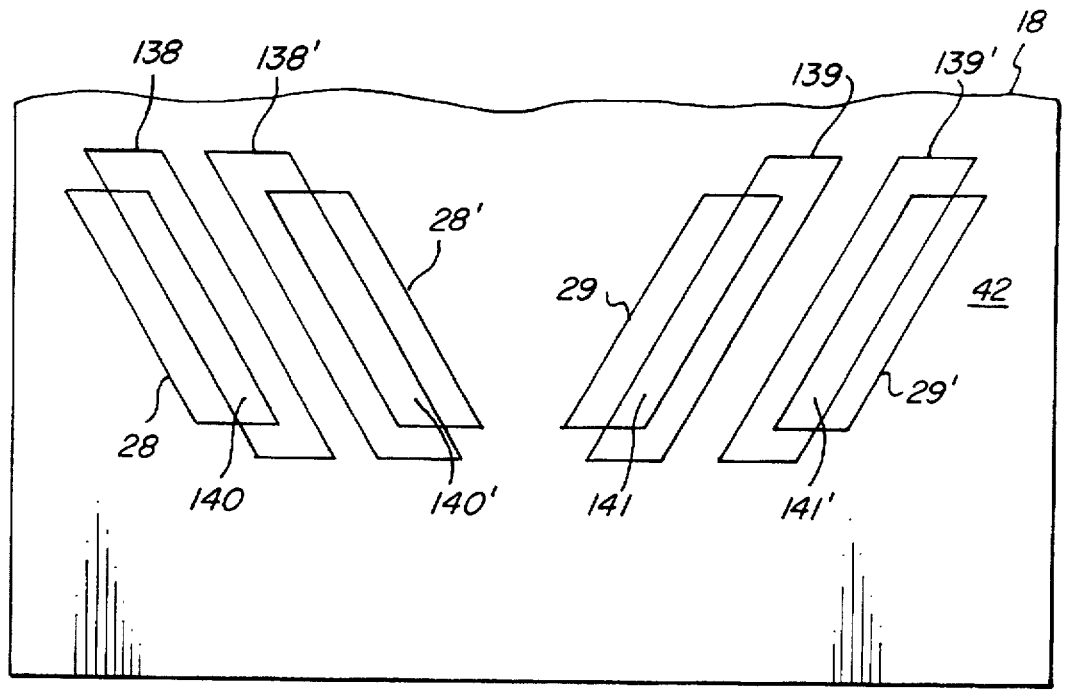

FIG. 6 is a schematic plan view of another portion of the detector illustrated in FIG. 3.

Figure 7:
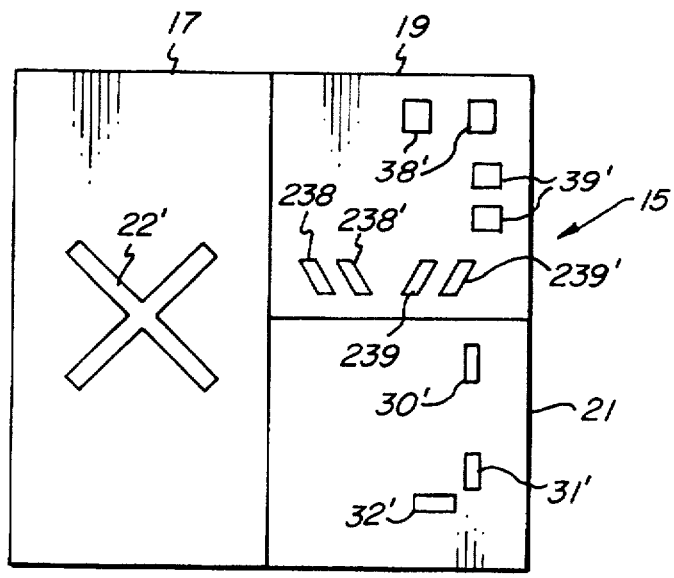

FIG. 7 is a schematic plan view of a reticle or mask illustrating the apertures therein.

FIG. 8A is a plan view illustrating an opening used for obtaining focus information.

FIG. 8B is a graph illustrating the signals obtained from the opening illustrated in FIG. 8A.

FIG. 9 is a plan view illustrating openings used for obtaining astigmatism information.

FIG. 9B is a graph illustrating the signal obtained from the openings illustrated in FIG. 9A.

DETAILED DESCRIPTION OF THE PREFERRED EMBODIMENTS

Figure 1:
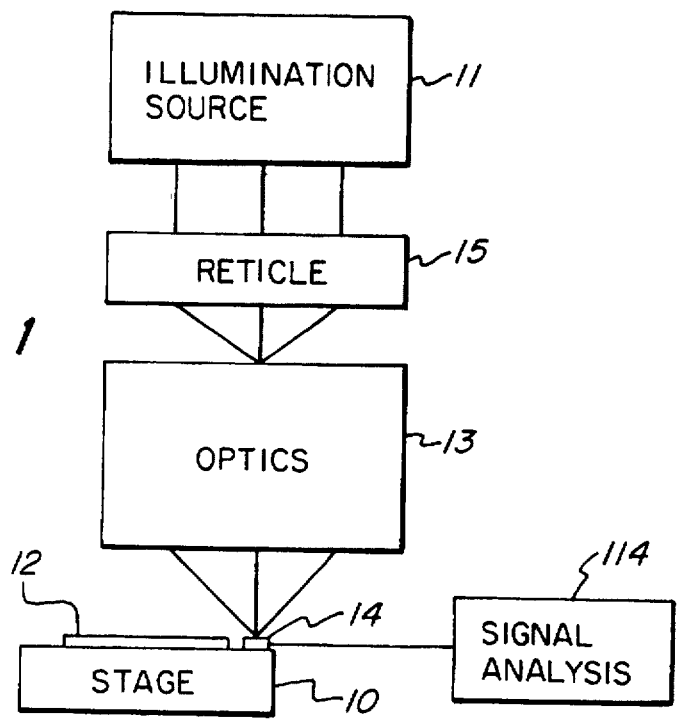
FIG. 1 is a block diagram illustrating a system according to the present invention.

FIG. 1 generally illustrates a photolithographic system utilizing the present invention. An illumination source 11 projects the image of a reticle 15 through optics 13 onto a photosensitive resist covered wafer 12. The wafer 12 is placed on an X-Y stage 10. A detector 14 is placed on the X-Y stage 10. Apertures in the reticle 15 are matched to openings on the detector 14. Detector 14 is moved so that the image of the appropriate reticle pattern falls on the apertures in an opaque layer. Signals from the detector 14 are interpreted by signal analysis of the data in function box 114. The matched apertures and openings provide desired imaging information, such as alignment and position information as well as image quality information.

FIG. 2 more clearly illustrates the top surface of the stage 10. Centrally positioned on the stage 10 is a wafer 12. The detector 14 is preferably positioned in one corner of the stage 10. The stage is movable along X and Y axes permitting accurate positioning of the detector 14.

FIG. 3 more clearly illustrates, but does not limit, the structure of a detector according to the present invention. The detector 14 is made up of a plurality of sub-detectors 16, 18, and 20. Sub-detector 16 provides information relating to coarse positioning. Sub-detector 18 provides information relating to fine positioning. Sub-detector 20 provides information relating to image quality. Sub-detector 16 is comprised of an exposed detector array 34. The whole detector array could be a conventional detector array such as a CCD or charge coupled device. Other arrays that could be used are, for example a CMOS array, a CMOS smart pixel array, and a photodiode array. This requires adequate sensitivity at the wavelength the whole system works at. Arrays such as CCD's or self scanned arrays are available at the main wavelengths possible, 365, 248, and 193 nanometers. X-ray arrays are also available. An illumination pattern 22, which is illustrated as an X-shape, but may be any other predetermined shape, is projected onto the exposed detector array 34. This illumination pattern is generated from an aperture in a reticle or mask. The detector array 34 is able to provide information relating to the general location of the illumination pattern 22, thereby providing coarse positioning information by standard pattern recognition techniques. The coarse positioning information is used to obtain a fairly precise location, to a few microns, of the detector 14 to facilitate the positioning of the sub-detector 18 used in establishing fine positioning information. The sub-detector 18 has an opaque chrome layer 42 with openings 24, 24', 26, 26', 28, 28', 29 and 29' therein. The openings 24, 24', 26, 26', 28, 28', 29 and 29' expose a portion of the detector array or photosensitive surface or layer, such as a CCD or charge coupled device. Openings 24 and 24' are used to determine positioning in the X direction. Openings 26 and 26' are used to determine positioning in the Y direction. Openings 28, 28', 29 and 29' are skewed, in relation to the X and Y movement of the stage 10, shown in FIGS. 1 and 2, and are used to obtain X and Y positioning information. The longitudinal axis of openings 28, 28', 29 and 29' are preferably skewed or offset 45° from the X and Y axes of the stage 10, shown in FIGS. 1 and 2. The openings 28, 28', 29 and 29' permit the detector of the present invention to be used with prior reticles that utilize similarly shaped skewed alignment apertures. Sub-detector 20 is formed by openings 30, 31, and 32 formed in an opaque chrome layer 42'. Opening 30 is used to obtain optimum focusing information. Openings 31 and 32 are used to obtain information relating to astigmatism. The openings 30, 31 and 32 in the opaque chrome layer 42' expose a photosensitive surface or layer, such as a CCD or charged coupled device. The exposed detector array 34 and the photosensitive surface or layer beneath the opaque layers 42 and 42' are preferably made from a single monolithic element. The detector 14 has openings 24, 24', 26, 26' 28, 28', 29, 29', 30, 31, and 32 that are matched to apertures formed in a reticle 15, shown in FIG. 1. By matched it is meant that the dimensions of the aperture are related to the dimensions of the openings such that the desired imaging information is obtained and also each relevent opening is matched to the element size of the array of detectors used. The apertures formed in a reticle cause light from an illumination source to be projected onto the openings 24, 24', 26, 26' 28, 28', 29, 29', 30, 31, and 32 in a predetermined way to establish imaging information, such as positioning and image quality. While only three sub-detectors 16, 18, and 20 have been illustrated with respect to detector 14, it should be appreciated that more than three sub-detectors 16, 18, and 20 may be formed on a single monolithic photosensitive surface, such as a CCD or charge coupled device. The application of an opaque chrome layer 42 or 42' to a portion of the photosensitive surface, and the ease in which the openings are manufactured permits flexibility and allows for multiple sub-detectors to be used. Additionally, each sub-detector may have a plurality of similar openings facilitating redundancy and signal averaging.

FIG. 4 more clearly illustrates a portion of the sub-detector 18 and its operation. The rectangular openings 24 and 24' formed in the opaque chrome surface 42 expose a photosensitive layer or surface 36 and 36'. The photosensitive surfaces 36 and 36' produce an electrical signal when illuminated by electromagnetic radiation from an illumination source. The photosensitive surface is preferably formed in an array, for example by a CCD or charge coupled device. The rectangular openings 24 and 24' are separated by a distance d. A reticle or mask having a matched or predetermined aperture creates an illumination pattern 38 to be projected onto the sub-detector 18. A portion of the illumination pattern 38 is caused to fall onto the photosensitive surfaces 36 and 36'. The portion of the illumination 38 falling onto the photosensitive surfaces 36 and 36' creates filled portions 40 and 40', respectively. The width of the illumination 38 need only be greater than the distance d between the openings 24 and 24', and less than the distance d plus the combined width of the two openings 24 and 24'. Therefore, the filled portions 40 and 40' could vary in width creating different fill ratios. The precise positioning of a reticle and stage on which the detector is mounted is easily obtained by balancing the electrical signals generated by the filled portions 40 and 40'. When the filled portions 40 and 40' are equal, the illumination pattern 38 is precisely centered between the openings 24 and 24'. Therefore, the reticle is precisely positioned with reference to the detector, and therefore the stage. This is accomplished without any scanning and it may be done in a static environment without the need to scan the detector and the reticle. Additionally, accurate signals used for alignment are obtained with pulsed illumination sources. A single pulse of illumination provides alignment information. The circuitry needed to detect a balanced signal generated from the filled portions 40 and 40' is relatively simple and well known, and can be made very accurate. This circuitry may be incorporated in the signal analysis 114, illustrated in FIG. 1. The relatively simple and economical structure also permits a plurality of similar openings in a detector and apertures in a reticle to be formed, permitting redundancy and averaging, which augments reliability and accuracy. The position along a single axis can therefore very accurately be obtained. By combining a plurality of openings and apertures having intersecting or orthogonal axes, X and Y, accurate alignment and positioning can very easily be obtained. Noise levels and micro variations in position with time can be determined by multiple time dispersed measurements FIG. 5 is a cross section taken along line 4—4 in FIG. 4 and illustrates the planar layered structure of the sub-detector 18. The opaque chrome layer 42 is formed on a silicon dioxide protective layer 44. The requirements of opacity are not high as the fill ratio is high. The protective layer 44 is transparent to the illumination and protects the photosensitive layer 46. The photosensitive layer 46 is formed on a substrate layer 48. The layers 44, 46, and 48 are generally illustrative of a CCD or charge coupled device which are commercially available. However, on commercial devices, the protective layer 44 is approximately 3 microns thick. This protective layer 44 may be reduced to 1 micron so that the opaque chrome layer 42 is closer to the photosensitive layer 46. This eliminates cross talk between the elements of the detector array due to light spreading. FIG. 5 clearly illustrates the illumination pattern 38 and the filled portions 40 and 40' illuminating the photosensitive layer 46.

FIG. 6 illustrates another portion of the sub-detector 18. FIG. 6 more clearly illustrates the application of the present invention to a different opening configuration. Openings 28, 28', 29 and 29' in the opaque chrome layer 42' expose the photosensitive surface to electromagnetic illumination. Similar matched or predetermined shaped apertures in a reticle form illumination patterns 138, 138', 139 and 139'. A portion of the illumination patterns 138, 138', 139, and 139' illuminate the photosensitive surface exposed by openings 28, 28', 29, and 29', to form filled portions 140, 140', 141 and 141'. Analogous to the embodiment illustrated in FIG. 4, the signals generated from the filled portions 140, 140', 141, and 141' are balanced or made equal so that precise alignment is obtained between the detector 14 affixed to the stage 10 and the reticle. The embodiment illustrated in FIG. 6 has the advantage of being compatible with existing reticles. Additionally, pairs of illumination patterns 138, 138', 139, and 139' are used with each pair of openings 140, 140', 141, and 141', respectfully. However, the illumination pattern does not have to be divided, and may be a single pair of illumination patterns, each spanning the distance between the openings 28, 28', 29, and 29', respectfully.

FIG. 7 illustrates a reticle used to create the illumination patterns illustrated in FIGS. 4, 5, and 6. The apertures in the reticle 15 are matched to the openings in detector 14. The reticle or mask 15 is comprised of a sub-reticles 17, 19, and 21, which correspond to the sub-detectors 16, 18, and 20, illustrated in FIG. 3. Sub-reticle 17 has an X-shaped aperture 22' therein. The aperture 22' forms the X-shaped illumination pattern 22 illustrated in FIG. 3. Sub-reticle 17 is used to obtain a general or course alignment or position. Sub-reticle 19 has apertures 38', 39', 238, 238', 239, and 239' therein. These apertures 38', 39', 238, 238', 239, and 239' are of a predetermined shape and location that are matched to the openings in the sub-detector 18, illustrated in FIG. 3. The apertures 38', 39', 238, 238', 239, 239' are projected or imaged onto the sub-detector 18, illustrated in FIG. 3. The signals derived from the illumination falling on the photosensitive layer are balanced as explained with reference to FIGS. 4, 5, and 6 in order to obtain accurate position and alignment information. It should be appreciated that when optics having a magnification are used, the dimensions of the apertures in the reticle 15 are appropriately proportioned in order to obtain the desired relationships for obtain a signal providing position and alignment information. For example, if reduction optics are used having a reduction ratio of 4 to 1, the mask would be appropriately proportioned to have predetermined sized apertures that are increased by a factor of 4. Sub-reticle 21 has apertures 30', 31' and 32' therein with predetermined positions and a shapes to match that of openings 30, 31, and 32 in sub-detector 20, illustrated in FIG. 3. The apertures 30', 31', and 32' are imaged onto the openings 30, 31, and 32 in sub-detector 20, illustrated in FIG. 3. The apertures 30' and 31' and 32' and openings 30, 31 and 32 are of a predetermined shape and size or matched to provide image quality information, such as focus and astigmatism. In this embodiment, the apertures 30', 31' and 32 are sized so as to produce an image whose isofocal intensity points matches the size of sub-detector 20. When imaged clearly or in focus the signal will be a maximum. The reticle 15 may be made by any conventional reticle manufacturing process, such as providing an opaque layer of chrome on a glass substrate. The opaque layer of chrome is etched to form the apertures therein by standard processing. The embodiment of the patterned opaque layer over the detector may be done by chrome coating the detector and patterning the layer by E-beam techniques, as in standard reticle manufacture. This may be done at the wafer stage of device fabrication. It is anticipated that the surface of the detector will be made plane to the accuracy required. Additionally, it should be appreciated that the reticle 15 is only a small portion of a larger reticle which will in general contain a circuit pattern thereon.

FIGS. 8A and B illustrate how the focus image quality is obtained. A relatively long, narrow rectangular opening 30 is formed in the sub-detector 20, illustrated in FIG. 3. A matching aperture 31 is formed in the sub-reticle 21, as illustrated in FIG. 7, such that when in focus the image of the aperture 30' and the edges of the opening 30 are coincident. Accordingly, when the system is in optimum focus, a maximum signal is obtained, and when the system is out of focus, a somewhat lesser signal is obtained. This is illustrated in the graph of FIG. 8B. The in-focus signal or optimum focus is illustrated as waveform 50 having a maximum signal amplitude. Waveform 52 illustrates the signal when the system is out of focus, illustrating a lower amplitude.

FIGS. 9A and B illustrate an analogous technique to measure astigmatism. Rectangular openings 31 and 32 have orthogonal longitudinal axes, and are matched to predetermined size apertures 31' and 32' in sub-reticle 21, illustrated in FIG. 7. The apertures 31' and 32' are sized to provide an optimum or in-focus image that is coincident with the edges of openings 31 and 32. Accordingly, when the system focus is zoomed in and out, depending upon any astigmatism of the system, an optimal focus along the X axes, corresponding to opening 32, and an optimal focus along the Y axes, corresponding to opening 31, will be obtained. This is illustrated in the graph of FIG. 9B, the X axis of the graph representing the focus and the Y axis of the graph the signal amplitude. Waveform 54 represents the maximum signal obtained from opening 32. The maximum point 58 corresponds to $f_x$ on the X axis of the graph. Similarly, waveform 56 represents the signal from opening 31 corresponding to $f_y$ on the Y axis of the graph. The distance between $f_x$ and $f_y$ is representative of the astigmatism of the system.

While various shapes and functions have been illustrated in the above embodiments, it should be appreciated that a variety of shapes may easily be obtained to provide imaging information, such as positioning and alignment information, as well as image quality, on a single monolithic detector that is easily and inexpensively manufactured. Additionally, it should be appreciated that the present detector provides a plurality of functions that can easily be changed or modified with little cost as well as easily providing redundancy. A number of repetitive openings may be used to provide redundancy in the event of a failure of some of the elements. Additionally, the use of a plurality or multiple repetitive openings permits signal averaging to obtain a more reliable information. Additionally, the present invention permits positioning and alignment information as well as image quality information to be obtained with pulsed illumination sources or in systems that do not scan. Accordingly, alignment information may be obtained for each pulse of the illumination source, such as a pulsed laser. For example, typically, a laser may pulse at 1000 Hz. This provides an updated alignment signal every millisecond. Additionally, variation or noise in the signal at steady state conditions is a measure of vibration levels in the system. The accuracy of the detector system depends upon the accuracy of the apertures and openings. Typically, with the width of an opening of one micron and approximately half the width being filled, 0.5 microns, by the illumination pattern, would yield sensitivities of 2.5 nanometers with a typical commercially available CCD having sensitivities in the order of 1%. This number may be varied by adjusting the filled portion or fill ratio. A vernier arrangement may be obtained by using multiple pairs of openings that are offset from each other by a known amount or distance so that a signal is obtained from the multiplicity of the sets whose most balanced sets supplies alignment information. Additionally, different configurations may be used to measure other aspects of image quality. For example, scatter may be approximated with the use of a small sampling window, approximately one micron square, that can be moved up to the line edge of an illumination pattern. The signal varies with distance from the edge of the illumination pattern, and its deviation from the diffraction limited prediction may be used to monitor the scatter levels of a lithographic tool. It is evident to one skilled in the art that there are a multitude of reticle opening/opaque layer aperture combinations that can exist to provide a multiplicity of information on the image quality and position. Consequently, there are detailed variances possible which will be clear to those skilled in the art. Accordingly, although the preferred embodiments have been illustrated and described, it will be obvious to those skilled in the art that various modifications may be made without departing from the spirit and scope of this invention, which is the use of matched pairs reticle: detector apertures.

What is claimed is:

1. A detector for use in photolithography comprising:

an illumination source;

a reticle, said reticle having a plurality of apertures therein;

optics, said optics projecting an image of said reticle;

a photosensitive layer placed on a stage; and an opaque layer formed on said photosensitive layer, said opaque layer having a plurality of openings therein, said plurality of openings predeterminatively positioned relative to said plurality of apertures in said reticle such that when the image of said reticle is projected onto said opaque layer and said photosensitive layer alignment information is obtained.

2. A detector as in claim 1 wherein:

said photosensitive layer comprises an array of individual elements.

3. A detector as in claim 2 wherein:

the array is a charge coupled device.

4. A detector as in claim 2 wherein:

the array is a CMOS array.

5. A detector as in claim 2 wherein:

the array is a CMOS smart pixel array.

6. A detector as in claim 2 wherein:

the array is a photodiode array.

7. A multiple function detector comprising:

a substrate;

a photosensitive layer placed on said substrate;

a first sub-detector formed from a first portion of said photosensitive layer, said first sub-detector determining course alignment;

a second sub-detector formed from a second portion of said photosensitive layer, said second sub-detector determining fine alignment; and a third sub-detector formed from a third portion of said photosensitive layer, said third sub-detector providing information on image quality.

8. A multiple function detector as in claim 7 further comprising:

an opaque layer placed over a portion of said second and third sub-detectors, said opaque layer having a plurality of openings therein, said openings having a predetermined shape and position, whereby position information and image quality may be obtained when the image of a matched reticle is projected onto said opaque layer and said photosensitive layer.

9. A multiple function detector as in claim 7 wherein:

said photosensitive layer is an array.

10. A multiple function detector as in claim 9 wherein:

said array is a charge coupled device.

11. A detector for use in photolithography comprising:

a photosensitive layer positioned on a portion of a stage;

an opaque layer placed over a portion of said photosensitive layer, said opaque layer having a plurality of openings therein, the plurality of openings having a predetermined shape and position; and a reticle having a plurality of apertures therein, the plurality of apertures having a predetermined shape and position relative to the plurality of openings in said opaque layer to produce imaging information.

12. A detector as in claim 11 wherein:

said photosensitive layer forms an array.

13. A detector as in claim 12 wherein:

the array is formed from a charge coupled device.

14. A detector as in claim 11 wherein:

the plurality of openings are quadrilaterals.

15. A detector as in claim 11 wherein:

the plurality of openings are rectangular.

16. A detector as in claim 11 wherein:

the plurality of openings are rhomboid.

17. A detector for use in photolithographic comprising:

a reticle, said reticle having a plurality of apertures therein;

optics, said optics projecting an image of said reticle;

a photosensitive layer placed on a movable stage;

an opaque layer placed over a portion of said photosensitive layer, said opaque layer having a plurality of openings therein, the plurality of apertures and the plurality of openings being related such that when the image of said reticle is projected onto said opaque layer and said photosensitive layer an image of said plurality of apertures in said reticle is projected onto the plurality of openings in said opaque layer, whereby imaging information is obtained from signals generated by said photosensitive layer.

18. A detector as in claim 17 wherein:

said photosensitive layer is an array.

19. A detector as in claim 18 wherein:

said array is a charge coupled device.

20. A detector as in claim 17 further comprising:

a signal analysis circuit, said signal analysis circuit receiving signals from portions of said photosensitive layer exposed by the plurality of openings in said opaque layer.

21. A alignment detector used in photolithography comprising:

a stage;

a photosensitive array placed on said stage, said photosensitive array being divided into a plurality of individual elements;

an opaque layer partially covering said photosensitive array, said opaque layer having a plurality of openings therein;

a reticle, said reticle having a plurality of apertures therein, one of said plurality of apertures having a dimension to project an image thereof onto a pair of said plurality of openings, illuminating a portion of each of the pair of said plurality of openings; and a signal analyses circuit coupled to the elements of said photosensitive array, said signal analysis circuit detecting signals generated from illumination striking said photosensitive array, whereby the position of said reticle relative to said stage is accurately determined.

22. A photolithographic alignment detector as in claim 21 wherein:

said signal analysis circuit indicates when signals from said photosensitive layer exposed by the pair of plurality of openings in said opaque layer are equal.

23. A detector for use in photolithography comprising:

a reticle, said reticle having an aperture therein;

a substantially opaque layer, said substantially opaque layer having an opening therein, the opening in said reticle being matched to the opening in said substantially opaque layer;

a photosensitive layer placed under the opening in said substantially opaque layer; and a signal analysis means, associated with said photosensitive layer, for analyzing a signal produced by said photosensitive layer, whereby an image of the aperture in the reticle is projected onto said photosensitive layer producing the signal containing imaging information.

24. A method of obtaining alignment information in photolithography comprising the steps of:

projecting an image of an aperture onto a pair of openings in an opaque layer on a photosensitive array; and adjusting the relative position of the image and the opaque layer until signals form each portion of the photosensitive array are substantially equal.

\* \* \* \* \*